United States Patent
Ohashi et al.

(10) Patent No.: US 10,337,100 B2
(45) Date of Patent: Jul. 2, 2019

(54) SPUTTERING TARGET COMPRISING NI—P ALLOY OR NI—PT—P ALLOY AND PRODUCTION METHOD THEREFOR

(71) Applicant: JX Nippon Mining & Metals Corporation, Tokyo (JP)

(72) Inventors: Kazumasa Ohashi, Ibaraki (JP); Kunihiro Oda, Ibaraki (JP)

(73) Assignee: JX NIPPON MINING & METALS CORPORATION, Tokyo (JP)

( * ) Notice: Subject to any disclaimer, the term of this patent is extended or adjusted under 35 U.S.C. 154(b) by 164 days.

(21) Appl. No.: 15/129,450

(22) PCT Filed: Mar. 12, 2015

(86) PCT No.: PCT/JP2015/057265
§ 371 (c)(1),
(2) Date: Sep. 27, 2016

(87) PCT Pub. No.: WO2015/146604
PCT Pub. Date: Oct. 2, 2015

(65) Prior Publication Data
US 2017/0121811 A1    May 4, 2017

(30) Foreign Application Priority Data

Mar. 27, 2014  (JP) ................ 2014-067132
Mar. 28, 2014  (JP) ................ 2014-068680

(51) Int. Cl.
| | | |
|---|---|---|
| *C23C 14/34* | (2006.01) | |
| *C23C 14/14* | (2006.01) | |
| *G11B 5/64* | (2006.01) | |
| *B22F 5/00* | (2006.01) | |
| *B22F 3/15* | (2006.01) | |
| *B22F 9/08* | (2006.01) | |
| *H01J 37/34* | (2006.01) | |
| *C22C 19/03* | (2006.01) | |
| *G11B 5/851* | (2006.01) | |
| *B22F 1/00* | (2006.01) | |
| *C22C 1/04* | (2006.01) | |

(52) U.S. Cl.
CPC ........ *C23C 14/3414* (2013.01); *B22F 1/0003* (2013.01); *B22F 3/15* (2013.01); *B22F 5/003* (2013.01); *B22F 9/082* (2013.01); *C22C 1/0433* (2013.01); *C22C 19/03* (2013.01); *C23C 14/14* (2013.01); *G11B 5/647* (2013.01); *G11B 5/851* (2013.01); *H01J 37/3426* (2013.01); *H01J 37/3429* (2013.01); *H01J 37/3491* (2013.01); *B22F 2301/15* (2013.01); *B22F 2998/10* (2013.01)

(58) Field of Classification Search
CPC . C22C 14/34; C22C 19/03; B22F 9/08; B22F 3/15; B22F 5/00; C23C 14/14; H01J 37/34; G11B 5/64; G11B 5/851
See application file for complete search history.

(56) References Cited

U.S. PATENT DOCUMENTS

| | | | |
|---|---|---|---|
| 6,730,415 B2 | 5/2004 | Shibuya et al. | |
| 6,797,137 B2* | 9/2004 | Sandlin | C23C 14/14 |
| | | | 148/313 |
| 7,229,588 B2* | 6/2007 | Sandlin | C23C 14/14 |
| | | | 204/298.12 |
| 7,767,139 B2 | 8/2010 | Hisano | |
| 7,959,782 B2 | 6/2011 | Shindo | |
| 7,972,583 B2* | 7/2011 | Oda | C23C 14/3414 |
| | | | 148/306 |
| 2003/0157370 A1* | 8/2003 | Nakamura | G11B 5/656 |
| | | | 428/836.3 |
| 2004/0256035 A1 | 12/2004 | Yamakoshi et al. | |
| 2007/0017803 A1* | 1/2007 | Ziani | C22C 19/07 |
| | | | 204/298.13 |
| 2007/0098590 A1 | 5/2007 | Shindo | |

FOREIGN PATENT DOCUMENTS

| | | | | |
|---|---|---|---|---|
| JP | S62-214107 A | | 9/1987 | |
| JP | H 06-136526 | * | 10/1992 | ............... B22F 1/00 |
| JP | H06-136526 A | | 5/1994 | |
| JP | H07-292463 A | | 11/1995 | |
| JP | 2000-309865 | * | 2/1999 | ............ C22C 19/03 |
| JP | 2001-295033 | * | 4/2000 | ............ C22C 19/03 |
| JP | 2000-309865 A | | 11/2000 | |
| JP | 2001-295033 A | | 10/2001 | |
| JP | 2011-208265 A | | 10/2011 | |
| JP | 2011208265 A | * | 10/2011 | |
| JP | 5337331 B2 | | 11/2013 | |

OTHER PUBLICATIONS

H. Hibst, E. Schwab, "Magnetic Recording Materials" Elec. & Mag.
Machine Translation for JP 2000-309865.*
Machine Translation for JPH 06-136526.*
Machine Translation for JP 2001-295033.*
I.E. Anderson, G. Schuster, L.L. Jones, "Fabrication of Sputtering Targets from Gas Atomized Powders for Hard Disk Drives", Advances in Powder Metallurgy & Particulate Materials (2008).* Prop. of Met. & Cer. Pt. II, vol. 14, VCH (1994).*

* cited by examiner

*Primary Examiner* — Kevin E Yoon
*Assistant Examiner* — Ryan L Heckman
(74) *Attorney, Agent, or Firm* — Howson & Howson LLP

(57) ABSTRACT

A method of producing a Ni—P alloy sputtering target, wherein a Ni—P alloy having a P content of 15 to 21 wt % and remainder being Ni and unavoidable impurities is melted and atomized to prepare a Ni—P alloy atomized powder having an average grain size of 100 µm or less, the Ni—P alloy atomized powder is mixed with a pure Ni atomized powder, and the obtained mixed powder is hot pressed. An object of the present invention is to provide a method of producing a Ni—P alloy sputtering target which achieves a small deviation from an intended composition.

4 Claims, No Drawings

SPUTTERING TARGET COMPRISING NI—P ALLOY OR NI—PT—P ALLOY AND PRODUCTION METHOD THEREFOR

BACKGROUND

The present invention relates to a sputtering target made from a Ni—P alloy or a Ni—Pt—P alloy for use in forming thin films via the sputtering method, and to a method of producing such a sputtering target.

Thin films made from a Ni—P alloy or a Ni—Pt—P alloy are used in hard disks and other magnetic recording mediums. These thin films are generally formed by sputtering a target made from a Ni—P alloy or a Ni—Pt—P alloy. As is well known, sputtering is a method of depositing a thin film, which has the substance configuring the target material as its basic component, on a substrate facing the target by sputtering grains from the target by the bombarding energy due to Ar ion irradiation toward the target. Since the target material collides with, and is accumulated on, the substrate surface in a high energy state, it is possible to form a dense film.

In relation to a Ni—P alloy target, for instance, Patent Document 1 discloses a Ni—P alloy sputtering target containing 12 to 24 at % of P, oxygen in an amount of 100 wtppm or less, and remainder being Ni and unavoidable impurities, wherein this sputtering target is produced by melting a Ni—P alloy base metal having an oxygen content of 10 wtppm or less and atomizing the product in an inert gas atmosphere to obtain an atomized powder having an average grain size of 100 µm or less, and thereafter hot pressing or hot isostatic pressing the obtained atomized powder. Patent Document 1 additionally describes that, according to this invention, it is possible to inhibit abnormal discharge, and prevent the generation of particles.

Patent Document 2 discloses a method of producing a Ni—P-based target including the steps of obtaining a gas atomized powder having Ni and P as its main components, thereafter causing the maximum grain size of the obtained gas atomized powder to be 100 µm or less via classification and/or pulverization, and subsequently performing pressure sintering. Patent Document 2 additionally discloses a Ni—P-based target having a maximum grain size of 100 µm or less, and an oxygen content of 300 ppm or less. Patent Document 2 describes that, according to this invention, the surface roughness of the eroded portion of the target will be finer than 10 µm Rmax, and the generation of foreign substances can be inhibited.

Patent Document 3 discloses a method of producing a sputtering target, wherein the compact obtained by thermally solidifying and molding a powder is cooled from a temperature near the molding temperature to 300° C. at a cooling rate of 144° C./hr to 36000° C./hr so that strain is applied to the sputtering target, whereby magnetic permeability can be reduced. Example 189 describes subjecting the Ni—P alloy powder prepared via gas atomization to HIP (hot isostatic pressing) at 950° C., but a liquid phase will be generated at this kind of high temperature, and the product cannot be processed into a target shape since the texture will be brittle.

Meanwhile, when a Ni—P alloy is melted and atomized as described above, a large amount of P will evaporate, and there is a problem in that an atomized powder having a composition that differs (deviated) from the intended composition will be formed. And when this kind of atomized powder having such a compositional deviation is subject to hot pressing or hot isostatic pressing, there is a problem in that the composition in the obtained target becomes uneven. Furthermore, there is a problem in that the density cannot be increased, and a high density target cannot be obtained.

Moreover, the present Applicant previously provided the following technology regarding a Ni alloy sputtering target. Patent Document 4 provides a technique of, by increasing the purity of the Ni—Pt alloy, considerably reducing the hardness of a Ni—Pt alloy ingot to enable rolling, and stably and efficiently producing a rolled target. Moreover, Patent Document 5 provides a nickel alloy target that does not contain any coarse crystal grains as a result of subjecting a nickel alloy ingot to forging, rolling and other processes.

These technologies exhibit a superior effect of being able to prevent the generation of fractures and cracks of a target and considerably suppress the generation of particles caused by the abnormal discharge during sputtering in comparison to targets produced based on conventional methods, but there were limitations inevitably to suppress the grain boundary fractures that are generated upon rolling the nickel alloy because a nickel alloy itself has the property of being extremely hard and brittle.

CITATION LIST

Patent Documents

Patent Document 1: JP 2000-309865 A
Patent Document 2: JP 2001-295033 A
Patent Document 3: Japanese Patent No. 5337331
Patent Document 4: JP 2010-047843 A
Patent Document 5: JP 2003-213406 A

SUMMARY

An object of the present invention is to provide a Ni—P alloy sputtering target having a uniform composition and a high density, which enables stable deposition, and in which the generation of particles is suppressed; and a method of producing a Ni—P alloy sputtering target which achieves a small deviation from the intended composition. Another object of the present invention is to provide a technique for stably and efficiently producing a high density Ni—Pt—P sputtering target based on powder metallurgy.

As a result of intense study to resolve the foregoing problems, the present inventors discovered that, with regard to a Ni—P alloy, the evaporation of P can be inhibited and the P content can be strictly controlled by mixing a Ni—P alloy powder having a high melting point and a pure Ni powder as the raw material powders and sintering the mixed powder. Moreover, with regard to a Ni—Pt—P alloy, the present inventors discovered that that the density of the sintered compact target can be improved by adding a prescribed amount of P (phosphorus) to the Ni raw material powder.

Based on the foregoing discovery, the present inventors provide the following invention.

1) A Ni—P alloy sputtering target containing 1 to 10 at % of P and remainder being Ni and unavoidable impurities, wherein density of the target is 90% or
2) The Ni—P alloy sputtering target according to 1) above, wherein a compositional variation in the target is within 5%.
3) The Ni—P alloy sputtering target according to 1) or 2) above, wherein an average crystal grain size of the target is 100 µm or less.
4) A method of producing a Ni—P alloy sputtering target, wherein a Ni—P alloy containing 15 to 21 wt % of P and remainder being Ni and unavoidable impurities is melted and atomized to prepare a Ni—P alloy atomized powder having an average grain size of 100 μm or less, the Ni—P alloy atomized powder is mixed with a Ni atomized powder, and the obtained mixed powder is hot pressed.

5) The method of producing a Ni—P alloy sputtering target according to 4) above, wherein hot isostatic pressing is performed after the hot press.

6) A Ni—Pt—P alloy sputtering target containing 1 to 10 at % of P, 1 to 30 at % of Pt, and remainder being Ni and unavoidable impurities, wherein density of the target is 95% or higher.

7) The Ni—Pt—P sputtering target according to 6) above, wherein a compositional variation in the target is within 5%.

8) The Ni—Pt—P sputtering target according to 6) or 7) above, wherein an average crystal grain size of the target is 100 μm or less.

9) A method of producing a Ni—Pt—P alloy sputtering target, wherein a Ni—P alloy containing 15 to 21 wt % of P and remainder being Ni and unavoidable impurities is melted and atomized to prepare a Ni—P alloy atomized powder having an average grain size of 100 μm or less, the Ni—P alloy atomized powder is mixed with a Ni atomized powder and a Pt powder, and the obtained mixed powder is hot pressed.

10) The method of producing a Ni—Pt—P sputtering target according to 9) above, wherein hot isostatic pressing is performed after the hot press.

The present invention can provide a high density Ni—P alloy sputtering target having a small compositional variation in which the evaporation of P, which is problematic in terms of safety, can be inhibited by strictly controlling the P content. Consequently, the present invention yields a superior effect of being able to form a thin film having favorable properties. Moreover, the present invention can provide a high density Ni—Pt—P alloy sputtering target based on powder metallurgy without requiring any large equipment for melting/casting and rolling processes. Consequently, the present invention yields a superior effect of being able to inhibit the generation of particles during sputtering.

DETAILED DESCRIPTION

[Ni—P Alloy Sputtering Target]

The Ni—P alloy sputtering target of the present invention is produced based on the powder sintering method. Foremost, a Ni—P alloy ingot having a P (phosphorus) content of 15 to 21 wt % (25 to 33.5 at %), and remainder being Ni (nickel) and unavoidable impurities is prepared. Next, the Ni—P alloy ingot is melted, and the molten metal is subject to spraying, rapid cooling and solidification (so-called atomization) in an inert gas atmosphere of argon, helium, nitrogen gas or the like in order to produce a Ni—P alloy atomized powder having an average grain size of 100 μm or less.

The reason why the P content is set to 15 to 21 wt % is because if the P content is less than 15% or exceeds 21%, the melting point will be 870° C. and 880° C., respectively, and the molten metal temperature will be too low for spraying the molten metal via atomization; therefore, it is difficult to effectively prepare a fine uniform atomized powder. Accordingly, by setting the P content to 15 to 21 wt %, the melting point can be maintained at 1000 to 1100° C., and a uniform powder can be obtained when the molten metal is subject to atomization and forced cooling. Moreover, the atomized powder of the present invention takes on a spherical shape, and the specific surface area can be suppressed. Consequently, the incorporation of oxygen can be inhibited.

Next, a Ni atomized powder is mixed with the foregoing Ni—P alloy atomized powder. The Ni mixed quantity may be adjusted suitably to achieve the intended composition in consideration of the P content in the Ni—P alloy atomized powder. Moreover, it is preferable to use the Ni atomized powder having an average grain size of 100 μm or less. Moreover, similar to the Ni—P alloy atomized powder, the Ni atomized powder of the present invention takes on a spherical shape, and the specific surface area can be suppressed.

Note that, it may also be possible to adjust the Ni—P alloy ingot and the Ni ingot, or the Ni ingot and the P powder to achieve the intended composition in advance, and melt and atomize the product in order to obtain a powder of the intended composition; but in such a case, a high temperature of roughly 1500° C. is required for the alloying process, and P having a high steam pressure easily becomes volatilized so that the compositional control becomes extremely difficult. Moreover, problems will arise in that the volatilization of P may cause contamination of the furnace body and incur a risk of causing ignition of the evaporative scaffolding or the like.

Next, the obtained mixed powder is hot pressed. The hot press is performed under the conditions of 750° C. to 850° C. (the melting point of an alloy is 870° C. or higher, and heating is performed at a lower temperature) and 100 to 300 kgf/cm$^2$. It is thereby possible to obtain a Ni—Pt alloy sputtering target material having a density of 80% or higher, containing 1 to 10 at % of P, and remainder being Ni and unavoidable impurities. The obtained Ni—Pt alloy sputtering target material is subject to standard processes, such as being cut into a target shape, then subject to grinding and polishing, and bonded to a backing plate, to obtain a Ni—P alloy sputtering target.

Moreover, in order to further increase the target density, it is effective to additionally subject the hot pressed Ni—P alloy sputtering target material to hot isostatic pressing and/or hot leveling. The hot isostatic pressing is performed under the conditions of 750 to 850° C. and 1200 to 2000 kgf/cm$^2$. It is thereby possible to obtain a Ni—P alloy target material having a density of 95% or higher.

With the Ni—P alloy sputtering target of the present invention, the compositional variation in the target can be suppressed to be within 5%. As described above, since the evaporation of P can be inhibited, it is possible to obtain a Ni—P alloy atomized powder having a uniform composition. Furthermore, by using this kind of atomized powder as the sintering raw material, it is possible to further suppress the compositional variation in the target, as well as in the thin film. The compositional variation in the present invention is calculated by measuring the P content at arbitrary locations of the target, and using the following formula which incorporates the maximum value, the minimum value, and the average value thereof.

Variation={(maximum value of P content)−(minimum value of P content)}/(average value of P content)

For instance, in a disk-shaped target, a total of 17 points can be measured; specifically, the center, 8 equal points of ½ R (radius), and 8 equal points located 1 cm inside from the outer periphery.

Moreover, with the Ni—P alloy sputtering target of the present invention, the average crystal grain size of the target can be 100 μm or less. Since a brittle Ni$_5$P$_2$ phase will be formed in a Ni—P alloy atomized powder having a P content of 15 to 21 wt %, the Ni—P alloy atomized powder can be easily refined, and by using this kind of processed powder as the sintering raw material, the average crystal grain size of the target can be refined. Furthermore, this kind of fine texture enables stable deposition, fewer generation of particles, and formation of quality films.

[Ni—Pt—P Alloy Sputtering Target]

The Ni—Pt—P alloy sputtering target of the present invention is produced based on the powder sintering method. Foremost, a Ni—P alloy ingot having a P (phosphorus) content of 15 to 21 wt % (25 to 33.5 at %), and remainder being Ni (nickel) and unavoidable impurities is prepared. The Ni—P alloy ingot is melted via induction heating, and the molten metal is subject to spraying, rapid cooling and solidification (so-called atomization) in an inert gas atmosphere of argon, helium, nitrogen gas or the like in order to prepare a Ni—P alloy atomized powder having an average grain size of 100 μm or less.

The reason why the P content in the Ni—P alloy ingot is set to 15 to 21 wt % is because if the P content is less than 15% or exceeds 21%, the melting point will be 870° C. and 880° C., respectively, and the molten metal temperature will be too low for spraying the molten metal via atomization; therefore, it is difficult to prepare a fine uniform atomized powder. Accordingly, by setting the P content to 15 to 21 wt %, the melting point can be maintained at around 1100° C., and a uniform powder can be obtained when the molten metal is subject to atomization and forced cooling.

The Ni—P alloy powder prepared via atomization as described above will encounter a substantial level of compositional variation due to the volatilization of P, but fine adjustment can be realized since this is a powder and can be mixed with other powders as needed in consideration of the P concentration that was measured through analysis in order to achieve the intended composition of the target. Thus, there is no need to be too sensitive regarding the volatilization of P. Note that the atomized powder of the present invention takes on a spherical shape, and the specific surface area can be suppressed. Consequently, the incorporation of oxygen can be inhibited.

Next, a Ni atomized powder and a Pt powder (Pt sponge) are mixed with the foregoing Ni—P alloy atomized powder. The mixed quantity of the Ni atomized powder and the Pt powder is adjusted suitably in consideration of the composition of the sintered compact (P: 1 to 10 at %, Pt: 1 to 30 at %, remainder is Ni and unavoidable impurities). Here, the Ni atomized powder plays the role of attenuating the P content in the Ni—P alloy atomized powder. Moreover, similar to the Ni—P alloy atomized powder, the Ni atomized powder and the Pt powder of the present invention take on a spherical shape, and the specific surface area can be suppressed.

Note that, it may also be possible to prepare the Ni—Pt—P target based on the melting method; but in such a case, a high temperature of roughly 1500° C. is required for melting and alloying the Ni raw material and the Pt raw material, and, when a Ni—P alloy is used as the source material for adding P, P having a considerably different melting point in comparison to Ni and Pt and having a high steam pressure will become volatilized so that there is a problem in that the compositional control becomes difficult. Moreover, problems will arise in that the volatilization of P may cause contamination of the furnace body and incur a risk of causing ignition of the evaporative scaffolding or the like.

Meanwhile, when only the Ni-15 to 21 wt % P alloy is melted, melting is possible at 1200° C. or lower, and the problem of the evaporation of P will not arise. Such being the case, by melting and atomizing only the Ni-15 to 21 wt % P alloy to obtain a Ni—P alloy powder, and by mixing with a Ni powder and a Pt powder and sintering the mixed powder, it is possible to prepare a Ni—Pt—P sputtering target with minimal evaporation of P.

Next, the obtained mixed powder of the Ni—P powder, the Ni powder, and the Pt powder is hot pressed. When Ni and Ni—P react and the P content reaches the range of 10 wt % or less, the melting point of the alloy becomes 870° C. and the alloy will melt in the press mold. Thus, heating is preferably performed at a lower temperature; specifically, 750° C. to 850° C. Moreover, pressure is preferably applied under the following conditions; namely, within a range of 100 to 300 kgf/cm² in accordance with the tolerable load of the mold. It is thereby possible to obtain a Ni—Pt—P sintered compact having a density of 90% or higher.

The thus obtained sintered compact (P: 1 to 10 at %, Pt: 1 to 30 at %, remainder is Ni and unavoidable impurities) is cut into a target shape and then subject to machining such as grinding and polishing in order to prepare a Ni—Pt—P sputtering target. When performing sputtering, the sputtering target is bonded to a backing plate made from copper, copper alloy or the like, and then mounted in sputtering equipment.

Moreover, in order to further increase the density of the sputtering target (sintered compact), it is effective to additionally subject the hot pressed sintered compact to hot isostatic pressing (HIP). HIP is performed under the following conditions; namely, temperature of 700° C. to 850° C. and pressure of 1000 to 2000 kgf/cm². It is thereby possible to obtain a Ni—Pt—P sputtering target having a density of 95% or higher.

Furthermore, the present invention can cause the compositional variation in the Ni—Pt—P sputtering target to be within 5%. As described above, since the evaporation of P can be inhibited according to the present invention, it is possible to obtain a Ni—P alloy atomized powder having a uniform composition, and, by using this kind of atomized powder as the sintering raw material, it is possible to further suppress the compositional variation in the target.

The compositional variation in the present invention is calculated by measuring the P content at arbitrary locations of the target, and using the following formula which incorporates the maximum value, the minimum value, and the average value thereof.

Variation={(maximum value of $P$ content)−(minimum value of $P$ content)}/(average value of $P$ content)

For instance, in a disk-shaped target, a total of 17 points can be measured; specifically, the center, 8 equal points of 0.5 R (radius), and 8 equal points located 1 cm inside from the outer periphery.

Moreover, with the Ni—Pt—P sputtering target of the present invention, the average crystal grain size of the target can be 100 μm or less. A rapidly cooled fine $Ni_5P_2$ dendrite phase is formed in the Ni—P alloy atomized powder having a P content of 15 to 21 wt %, and this has a relatively high melting point; therefore, crystal grain growth will not occur easily at the foregoing press temperature. Accordingly, by using this kind of processed powder as the sintering raw material, the crystal grains can be refined. Furthermore, this kind of fine texture enables stable deposition, fewer particles, and formation of quality films.

EXAMPLES

The Examples are now explained. Note that these Examples merely illustrate embodiments of the present invention, and the present invention is not limited by these Examples. In other words, the present invention covers other modes and modifications that are included in the technical concept of this invention.

Example 1-1

A Ni—P alloy ingot having a P content of 17 wt % was melted via induction heating, and gas atomization was used to obtain a Ni-17 wt % P alloy atomized powder. The obtained atomized powder was generally of a spherical shape. Moreover, the grain size of this raw material powder was 120 µm. Next, a Ni atomized powder having a grain size of 100 µm was mixed with the Ni—P alloy atomized powder to attain a P content of 1 at %. Next, the obtained mixed powder was hot pressed under the conditions of 830° C. and 300 kgf/cm². Consequently, a Ni—P alloy sintered compact having a P content of 1 at % and remainder being Ni and unavoidable impurities was obtained. Moreover, the density of the obtained sintered compact was 80%. Next, the obtained sintered compact was sealed in an SUS can and subject to HIP (hot isostatic pressing) under the conditions of 830° C. and 1500 kgf/cm². As a result, the density of the obtained sintered compact was 95%.

The thus obtained Ni—P alloy sintered compact was subject to machining such as grinding and polishing to prepare a disk-shaped sputtering target having a diameter of 440 mm ϕ and a thickness of 3 mmt. The compositional variation in the obtained sputtering target was examined. Consequently, the compositional variation was within 5%. Next, the average crystal grain size of this sputtering target was examined using the crosscut method based on JISH0501. Consequently, the average crystal grain size was 100 µm. Subsequently, this sputtering target was diffusion-bonded (instead, In-bonding may be adopted) to a backing plate made from copper alloy to prepare an assembly of a Ni—P alloy sputtering target and a copper alloy backing plate. Sputtering was performed using the assembly to form a Ni—P alloy thin film. The generation of particles in the obtained thin film was examined. The result was 5 particles. The foregoing results are shown in Table 1.

Sputtering deposition was performed based on the following conditions (the same conditions were used in the ensuing Examples and Comparative Examples).
<deposition conditions>
  Power source: DC system
  Power: 15 kW
  Ultimate vacuum: 5×10⁻⁸ Torr
  Atmosphere gas composition: Ar
  Sputter gas pressure: 5×10⁻³ Torr
  Sputtering time: 15 seconds Example 1-2

A Ni—P alloy ingot having a P content of 17 wt % was melted via induction heating, and gas atomization was used to obtain a Ni-17 wt % P alloy atomized powder. The obtained atomized powder was generally of a spherical shape. Moreover, the grain size of this raw material powder was 120 µm. Next, a Ni atomized powder having a grain size of 100 µm was mixed with the Ni—P alloy atomized powder to attain a P content of 2 at %. Next, the obtained mixed powder was hot pressed under the conditions of 830° C. and 300 kgf/cm². Consequently, a Ni—P alloy sintered compact having a P content of 1 at % and remainder being Ni and unavoidable impurities was obtained. Moreover, the density of the obtained sintered compact was 80%. Next, the obtained sintered compact was sealed in an SUS can and subject to HIP (hot isostatic pressing) under the conditions of 830° C. and 1500 kgf/cm². As a result, the density of the obtained sintered compact was 95%.

The thus obtained Ni—P alloy sintered compact was subject to machining such as grinding and polishing to prepare a disk-shaped sputtering target having a diameter of 440 mm ϕ and a thickness of 3 mmt. The compositional variation in the obtained sputtering target was examined. Consequently, the compositional variation was within 4%. Next, the average crystal grain size of this sputtering target was examined using the crosscut method based on JISH0501. Consequently, the average crystal grain size was 100 µm. Subsequently, this sputtering target was diffusion-bonded (instead, In-bonding may be adopted) to a backing plate made from copper alloy to prepare an assembly of a Ni—P alloy sputtering target and a copper alloy backing plate. Sputtering was performed using the assembly to form a Ni—P alloy thin film. The generation of particles in the obtained thin film was examined. The result was 5 particles.

Example 1-3

A Ni—P alloy ingot having a P content of 17 wt % was melted via induction heating, and gas atomization was used to obtain a Ni-17 wt % P alloy atomized powder. The obtained atomized powder was generally of a spherical shape. Moreover, the grain size of this raw material powder was 120 µm. Next, a Ni atomized powder having a grain size of 100 µm was mixed with the Ni—P alloy atomized powder to attain a P content of 5 at %. Next, the obtained mixed powder was hot pressed under the conditions of 830° C. and 300 kgf/cm². Consequently, a Ni—P alloy sintered compact having a P content of 1 at % and remainder being Ni and unavoidable impurities was obtained. Moreover, the density of the obtained sintered compact was 80%. Next, the obtained sintered compact was sealed in an SUS can and subject to HIP (hot isostatic pressing) under the conditions of 830° C. and 1500 kgf/cm². As a result, the density of the obtained sintered compact was 95%.

The thus obtained Ni—P alloy sintered compact was subject to machining such as grinding and polishing to prepare a disk-shaped sputtering target having a diameter of 440 mm ϕ and a thickness of 3 mmt. The compositional variation in the obtained sputtering target was examined. Consequently, the compositional variation was within 3%. Next, the average crystal grain size of this sputtering target was examined using the crosscut method (method of examining crystal grain size) based on JISH0501. Consequently, the average crystal grain size was 100 µm. Subsequently, this sputtering target was diffusion-bonded (instead, In-bonding may be adopted) to a backing plate made from copper alloy to prepare an assembly of a Ni—P alloy sputtering target and a copper alloy backing plate. Sputtering was performed using the assembly to form a Ni—P alloy thin film. The generation of particles in the obtained thin film was examined. The result was 5 particles.

Example 1-4

A Ni—P alloy ingot having a P content of 17 wt % was melted via induction heating, and gas atomization was used to obtain a Ni-17 wt % P alloy atomized powder. The obtained atomized powder was generally of a spherical shape. Moreover, the grain size of this raw material powder was 120 µm. Next, a Ni atomized powder having a grain size of 100 µm was mixed with the Ni—P alloy atomized powder to attain a P content of 10 at %. Next, the obtained mixed powder was hot pressed under the conditions of 830° C. and 300 kgf/cm². Consequently, a Ni—P alloy sintered compact having a P content of 1 at % and remainder being Ni and unavoidable impurities was obtained. Moreover, the density of the obtained sintered compact was 80%. Next, the obtained sintered compact was sealed in an SUS can and subject to HIP (hot isostatic pressing) under the conditions of 830° C. and 1500 kgf/cm². As a result, the density of the obtained sintered compact was 95%.

The thus obtained Ni—P alloy sintered compact was subject to machining such as grinding and polishing to prepare a disk-shaped sputtering target having a diameter of 440 mm ϕ and a thickness of 3 mmt. The compositional variation in the obtained sputtering target was examined. Consequently, the compositional variation was within 2%. Next, the average crystal grain size of this sputtering target was examined using the crosscut method based on JISH0501. Consequently, the average crystal grain size was 100 µm. Subsequently, this sputtering target was diffusion-bonded (instead, In-bonding may be adopted) to a backing plate made from copper alloy to prepare an assembly of a Ni—P alloy sputtering target and a copper alloy backing plate. Sputtering was performed using the assembly to form a Ni—P alloy thin film. The generation of particles and compositional variation in the obtained thin film were examined. The result was 5 particles.

Comparative Example 1-1

A Ni—P alloy ingot and a Ni ingot were melted via induction heating to achieve a P content of 1 at %, and gas atomization was used to prepare a powder. Consequently, a Ni-0.8 at % P alloy atomized powder was obtained. P evaporated within the device and the composition deviated from the intended composition.

Comparative Example 1-2

A Ni—P alloy ingot and a Ni ingot were melted via induction heating to achieve a P content of 2 at %, and gas atomization was used to prepare a powder. Consequently, a Ni-1.8 at % P alloy atomized powder was obtained. P evaporated within the device and the composition deviated from the intended composition.

Comparative Example 1-3

A Ni—P alloy ingot and a Ni ingot were melted via induction heating to achieve a P content of 5 at %, and gas atomization was used to prepare a powder. Consequently, a Ni-4.5 at % P alloy atomized powder was obtained. P evaporated within the device and the composition deviated from the intended composition.

Comparative Example 1-4

A Ni—P alloy ingot and a Ni ingot were melted via induction heating to achieve a P content of 10 at %, and gas atomization was used to prepare a powder. Consequently, a Ni-9.7 at % P alloy atomized powder was obtained. P evaporated within the device and the composition deviated from the intended composition.

TABLE 1

| | | | | HP conditions | | |
| --- | --- | --- | --- | --- | --- | --- |
| | Raw material powder | Target composition | Powder composition | Temperature (° C.) | Pressure (kgf) | Sintered compact composition |
| Example 1-1 | Ni—17 wt % P atomized + Ni atomized | Ni—1 at % P | Ni—1 at % P | 830 | 300 | Ni—1 at % P |
| Example 1-2 | Ni—17 wt % P atomized + Ni atomized | Ni—2 at % P | Ni—2 at % P | 830 | 300 | Ni—2 at % P |
| Example 1-3 | Ni—17 wt % P atomized + Ni atomized | Ni—5 at % P | Ni—5 at % P | 830 | 300 | Ni—5 at % P |
| Example 1-4 | Ni—17 wt % P atomized + Ni atomized | Ni—10 at % P | Ni—10 at % P | 830 | 300 | Ni—10 at % P |
| Comparative Example 1-1 | Ni—P + Ni melted → atomized | Ni—1 at % P | Ni—0.8 at % P | — | — | — |
| Comparative Example 1-2 | Ni—P + Ni melted → atomized | Ni—2 at % P | Ni—1.8 at % P | — | — | — |
| Comparative Example 1-3 | Ni—P + Ni melted → atomized | Ni—5 at % P | Ni—4.5 at % P | — | — | — |
| Comparative Example 1-4 | Ni—P + Ni melted → atomized | Ni—10 at % P | Ni—9.7 at % P | — | — | — |

| | | | HIP conditions | | | |
| --- | --- | --- | --- | --- | --- | --- |
| | Deviation after HP | Density after HP (%) | Temperature (° C.) | Pressure (kgf) | Density after HIP (%) | Number of particles | Compositional variation (%) |
| Example 1-1 | None | 80 | 830 | 1500 | 95 | 5 | 5 |
| Example 1-2 | None | 80 | 830 | 1500 | 95 | 5 | 4 |
| Example 1-3 | None | 80 | 830 | 1500 | 95 | 5 | 3 |
| Example 1-4 | None | 80 | 830 | 1500 | 95 | 5 | 2 |
| Comparative Example 1-1 | — | — | — | — | — | — | — |
| Comparative Example 1-2 | — | — | — | — | — | — | — |
| Comparative Example 1-3 | — | — | — | — | — | — | — |
| Comparative Example 1-4 | — | — | — | — | — | — | — |

Example 2-1

A Ni—P alloy ingot containing 17 at % of P was melted via induction heating, and gas atomization was used to obtain a Ni-17 at % P alloy atomized powder. The obtained atomized powder was generally of a spherical shape. Next, a Ni atomized powder and a Pt powder were mixed with the Ni—P alloy atomized powder. The obtained mixed powder was hot pressed under the conditions of 830° C. and 300 kgf/cm$^2$. Consequently, a Ni—Pt—P-based sintered compact having a Pt content of 20 at %, a P content of 1 at % and remainder being Ni and unavoidable impurities was obtained. Moreover, the density of the obtained sintered compact was 80%. Next, the obtained sintered compact was sealed in an SUS can and subject to HIP (hot isostatic pressing) under the conditions of 830° C. and 1500 kgf/cm$^2$. As a result, the density of the obtained sintered compact was 95%.

The thus obtained Ni—Pt—P sintered compact was subject to machining such as grinding and polishing to prepare a disk-shaped sputtering target having a diameter of 440 mmφ and a thickness of 3 mmt. The compositional variation in the obtained sputtering target was examined. Consequently, the compositional variation was within 4%. Next, the average crystal grain size of this sputtering target was examined using the crosscut method based on JISH0501. Consequently, the average crystal grain size was 60 µm. Subsequently, this sputtering target was diffusion-bonded (instead, In-bonding may be adopted) to a backing plate made from copper alloy to prepare an assembly of a Ni—Pt—P alloy sputtering target and a copper alloy backing plate. Sputtering was performed using the assembly to form a Ni—Pt—P alloy thin film. The generation of particles and compositional variation in the obtained thin film were examined. The result was 50 particles.

Example 2-2

A Ni—P alloy ingot containing 18 at % of P was melted via induction heating, and gas atomization was used to obtain a Ni-18 at % P alloy atomized powder. The obtained atomized powder was generally of a spherical shape. Next, a Ni atomized powder and a Pt powder were mixed with the Ni—P alloy atomized powder. The obtained mixed powder was hot pressed under the conditions of 830° C. and 300 kgf/cm$^2$. Consequently, a Ni—Pt—P sintered compact having a Pt content of 30 at %, a P content of 1 at % and remainder being Ni and unavoidable impurities was obtained. Moreover, the density of the obtained sintered compact was 80%. Next, the obtained sintered compact was sealed in an SUS can and subject to HIP (hot isostatic pressing) under the conditions of 830° C. and 1500 kgf/cm$^2$. As a result, the density of the obtained sintered compact was 95%.

The thus obtained Ni—Pt—P sintered compact was subject to machining such as grinding and polishing to prepare a disk-shaped sputtering target having a diameter of 440 mm φ and a thickness of 3 mmt. The compositional variation in the obtained sputtering target was examined. Consequently, the compositional variation was within 4%. Next, the average crystal grain size of this sputtering target was examined using the crosscut method based on JISH0501. Consequently, the average crystal grain size was 70 µm. Subsequently, this sputtering target was diffusion-bonded to a backing plate made from copper alloy to prepare an assembly of a Ni—Pt—P sputtering target and a copper alloy backing plate. Sputtering was performed using the assembly to form a Ni—Pt—P thin film. The generation of particles and compositional variation in the obtained thin film were examined. The result was 100 particles.

Example 2-3

A Ni—P alloy ingot containing 19 at % of P was melted via induction heating, and gas atomization was used to obtain a Ni-19 at % P alloy atomized powder. The obtained atomized powder was generally of a spherical shape. Next, a Ni atomized powder and a Pt powder were mixed with the Ni—P alloy atomized powder. The obtained mixed powder was hot pressed under the conditions of 830° C. and 300 kgf/cm$^2$. Consequently, a Ni—Pt—P alloy sintered compact having a Pt content of 10 at %, a P content of 2 at % and remainder being Ni and unavoidable impurities was obtained. Moreover, the density of the obtained sintered compact was 80%. Next, the obtained sintered compact was sealed in an SUS can and subject to HIP (hot isostatic pressing) under the conditions of 830° C. and 1500 kgf/cm$^2$. As a result, the density of the obtained sintered compact was 95%.

The thus obtained Ni—Pt—P sintered compact was subject to machining such as grinding and polishing to prepare a disk-shaped sputtering target having a diameter of 440 mm φ and a thickness of 3 mmt. The compositional variation in the obtained sputtering target was examined. Consequently, the compositional variation was within 4%. Next, the average crystal grain size of this sputtering target was examined using the crosscut method based on JISH0501. Consequently, the average crystal grain size was 65 µm. Subsequently, this sputtering target was diffusion-bonded to a backing plate made from copper alloy to prepare an assembly of a Ni—Pt—P sputtering target and a copper alloy backing plate. Sputtering was performed using the assembly to form a Ni—Pt—P thin film. The generation of particles and compositional variation in the obtained thin film were examined. The result was 50 particles.

Example 2-4

A Ni—P alloy ingot containing 20 at % of P was melted via induction heating, and gas atomization was used to obtain a Ni-20 at % P alloy atomized powder. The obtained atomized powder was generally of a spherical shape. Next, a Ni atomized powder and a Pt powder were mixed with the Ni—P alloy atomized powder. The obtained mixed powder was hot pressed under the conditions of 830° C. and 300 kgf/cm$^2$. Consequently, a Ni—Pt—P sintered compact having a Pt content of 20 at %, a P content of 2 at % and remainder being Ni and unavoidable impurities was obtained. Moreover, the density of the obtained sintered compact was 80%. Next, the obtained sintered compact was sealed in an SUS can and subject to HIP (hot isostatic pressing) under the conditions of 830° C. and 1500 kgf/cm$^2$. As a result, the density of the obtained sintered compact was 95%.

The thus obtained Ni—Pt—P sintered compact was subject to machining such as grinding and polishing to prepare a disk-shaped sputtering target having a diameter of 440 mm φ and a thickness of 3 mmt. The compositional variation in the obtained sputtering target was examined. Consequently, the compositional variation was within 4%. Next, the average crystal grain size of this sputtering target was examined using the crosscut method based on JISH0501. Consequently, the average crystal grain size was 70 µm. Subsequently, this sputtering target was diffusion-bonded to a backing plate made from copper alloy to prepare an assembly of a Ni—Pt—P sputtering target and a copper alloy backing plate. Sputtering was performed using the assembly to form a Ni—Pt—P thin film. The generation of particles and compositional variation in the obtained thin film were examined. The result was 50 particles.

Example 2-5

A Ni—P alloy ingot containing 21 at % of P was melted via induction heating, and gas atomization was used to obtain a Ni-21 at % P alloy atomized powder. The obtained atomized powder was generally of a spherical shape. Next, a Ni atomized powder and a Pt powder were mixed with the Ni—P alloy atomized powder. The obtained mixed powder was hot pressed under the conditions of 830° C. and 300 kgf/cm². Consequently, a Ni—Pt—P sintered compact having a Pt content of 20 at %, a P content of 5 at % and remainder being Ni and unavoidable impurities was obtained. Moreover, the density of the obtained sintered compact was 80%. Next, the obtained sintered compact was sealed in an SUS can and subject to HIP (hot isostatic pressing) under the conditions of 830° C. and 1500 kgf/cm². As a result, the density of the obtained sintered compact was 95%.

The thus obtained Ni—Pt—P sintered compact was subject to machining such as grinding and polishing to prepare a disk-shaped sputtering target having a diameter of 440 mm φ and a thickness of 3 mmt. The compositional variation in the obtained sputtering target was examined. Consequently, the compositional variation was within 4%. Next, the average crystal grain size of this sputtering target was examined using the crosscut method based on JISH0501. Consequently, the average crystal grain size was 80 μm. Subsequently, this sputtering target was diffusion-bonded to a backing plate made from copper alloy to prepare an assembly of a Ni—Pt—P sputtering target and a copper alloy backing plate. Sputtering was performed using the assembly to form a Ni—Pt—P thin film. The generation of particles and compositional variation in the obtained thin film were examined. The result was 50 particles.

Example 2-6

A Ni—P alloy ingot containing 22 at % of P was melted via induction heating, and gas atomization was used to obtain a Ni-22 at % P alloy atomized powder. The obtained atomized powder was generally of a spherical shape. Next, a Ni atomized powder and a Pt powder were mixed with the Ni—P alloy atomized powder. The obtained mixed powder was hot pressed under the conditions of 830° C. and 300 kgf/cm². Consequently, a Ni—Pt—P sintered compact having a Pt content of 30 at %, a P content of 5 at % and remainder being Ni and unavoidable impurities was obtained. Moreover, the density of the obtained sintered compact was 80%. Next, the obtained sintered compact was sealed in an SUS can and subject to HIP (hot isostatic pressing) under the conditions of 830° C. and 1500 kgf/cm². As a result, the density of the obtained sintered compact was 95%.

The thus obtained Ni—Pt—P sintered compact was subject to machining such as grinding and polishing to prepare a disk-shaped sputtering target having a diameter of 440 mm φ and a thickness of 3 mmt. The compositional variation in the obtained sputtering target was examined. Consequently, the compositional variation was within 4%. Next, the average crystal grain size of this sputtering target was examined using the crosscut method based on JISH0501. Consequently, the average crystal grain size was 75 μm. Subsequently, this sputtering target was diffusion-bonded to a backing plate made from copper alloy to prepare an assembly of a Ni—Pt—P sputtering target and a copper alloy backing plate. Sputtering was performed using the assembly to form a Ni—Pt—P thin film. The generation of particles and compositional variation in the obtained thin film were examined. The result was 100 particles.

Example 2-7

A Ni—P alloy ingot containing 23 at % of P was melted via induction heating, and gas atomization was used to obtain a Ni-23 at % P alloy atomized powder. The obtained atomized powder was generally of a spherical shape. Next, a Ni atomized powder and a Pt powder were mixed with the Ni—P alloy atomized powder. The obtained mixed powder was hot pressed under the conditions of 830° C. and 300 kgf/cm². Consequently, a Ni—Pt—P sintered compact having a Pt content of 10 at %, a P content of 10 at % and remainder being Ni and unavoidable impurities was obtained. Moreover, the density of the obtained sintered compact was 80%. Next, the obtained sintered compact was sealed in an SUS can and subject to HIP (hot isostatic pressing) under the conditions of 830° C. and 1500 kgf/cm². As a result, the density of the obtained sintered compact was 95%.

The thus obtained Ni—Pt—P sintered compact was subject to machining such as grinding and polishing to prepare a disk-shaped sputtering target having a diameter of 440 mm φ and a thickness of 3 mmt. The compositional variation in the obtained sputtering target was examined. Consequently, the compositional variation was within 4%. Next, the average crystal grain size of this sputtering target was examined using the crosscut method based on JISH0501. Consequently, the average crystal grain size was 70 μm. Subsequently, this sputtering target was diffusion-bonded to a backing plate made from copper alloy to prepare an assembly of a Ni—Pt—P sputtering target and a copper alloy backing plate. Sputtering was performed using the assembly to form a Ni—Pt—P thin film. The generation of particles and compositional variation in the obtained thin film were examined. The result was 50 particles.

Example 2-8

A Ni—P alloy ingot containing 24 at % of P was melted via induction heating, and gas atomization was used to obtain a Ni-24 at % P alloy atomized powder. The obtained atomized powder was generally of a spherical shape. Next, a Ni atomized powder and a Pt powder were mixed with the Ni—P alloy atomized powder. The obtained mixed powder was hot pressed under the conditions of 830° C. and 300 kgf/cm². Consequently, a Ni—Pt—P sintered compact having a Pt content of 20 at %, a P content of 10 at % and remainder being Ni and unavoidable impurities was obtained. Moreover, the density of the obtained sintered compact was 80%. Next, the obtained sintered compact was sealed in an SUS can and subject to HIP (hot isostatic pressing) under the conditions of 830° C. and 1500 kgf/cm². As a result, the density of the obtained sintered compact was 95%.

The thus obtained Ni—Pt—P sintered compact was subject to machining such as grinding and polishing to prepare a disk-shaped sputtering target having a diameter of 440 mm φ and a thickness of 3 mmt. The compositional variation in the obtained sputtering target was examined. Consequently, the compositional variation was within 4%. Next, the average crystal grain size of this sputtering target was examined using the crosscut method based on JISH0501. Consequently, the average crystal grain size was 70 μm. Subsequently, this sputtering target was diffusion-bonded to a backing plate made from copper alloy to prepare an assembly of a Ni—Pt—P sputtering target and a copper alloy backing plate. Sputtering was performed using the assembly to form a Ni—Pt—P thin film. The generation of particles and compositional variation in the obtained thin film were examined. The result was 50 particles.

Example 2-9

A Ni—P alloy ingot containing 25 at % of P was melted via induction heating, and gas atomization was used to obtain a Ni-25 at % P alloy atomized powder. The obtained atomized powder was generally of a spherical shape. Next, a Ni atomized powder and a Pt powder were mixed with the Ni—P alloy atomized powder. The obtained mixed powder was hot pressed under the conditions of 830° C. and 300 kgf/cm². Consequently, a Ni—Pt—P sintered compact having a Pt content of 5 at %, a P content of 1 at % and remainder being Ni and unavoidable impurities was obtained. Moreover, the density of the obtained sintered compact was 80%. Next, the obtained sintered compact was sealed in an SUS can and subject to HIP (hot isostatic pressing) under the conditions of 830° C. and 1500 kgf/cm². As a result, the density of the obtained sintered compact was 95%.

The thus obtained Ni—Pt—P sintered compact was subject to machining such as grinding and polishing to prepare a disk-shaped sputtering target having a diameter of 440 mm φ and a thickness of 3 mmt. The compositional variation in the obtained sputtering target was examined. Consequently, the compositional variation was within 4%. Next, the average crystal grain size of this sputtering target was examined using the crosscut method based on JISH0501. Consequently, the average crystal grain size was 70 μm. Subsequently, this sputtering target was diffusion-bonded to a backing plate made from copper alloy to prepare an assembly of a Ni—Pt—P sputtering target and a copper alloy backing plate. Sputtering was performed using the assembly to form a Ni—Pt—P thin film. The generation of particles and compositional variation in the obtained thin film were examined. The result was 50 particles.

Example 2-10

A Ni—P alloy ingot containing 26 at % of P was melted via induction heating, and gas atomization was used to obtain a Ni-26 at % P alloy atomized powder. The obtained atomized powder was generally of a spherical shape. Next, a Ni atomized powder and a Pt powder were mixed with the Ni—P alloy atomized powder. The obtained mixed powder was hot pressed under the conditions of 830° C. and 300 kgf/cm². Consequently, a Ni—Pt—P alloy sintered compact having a Pt content of 5 at %, a P content of 2 at % and remainder being Ni and unavoidable impurities was obtained. Moreover, the density of the obtained sintered compact was 80%. Next, the obtained sintered compact was sealed in an SUS can and subject to HIP (hot isostatic pressing) under the conditions of 830° C. and 1500 kgf/cm². As a result, the density of the obtained sintered compact was 95%.

The thus obtained Ni—Pt—P alloy sintered compact was subject to machining such as grinding and polishing to prepare a disk-shaped sputtering target having a diameter of 440 mm φ and a thickness of 3 mmt. The compositional variation in the obtained sputtering target was examined. Consequently, the compositional variation was within 4%. Next, the average crystal grain size of this sputtering target was examined using the crosscut method based on JISH0501. Consequently, the average crystal grain size was 70 μm. Subsequently, this sputtering target was diffusion-bonded to a backing plate made from copper alloy to prepare an assembly of a Ni—Pt—P sputtering target and a copper alloy backing plate. Sputtering was performed using the assembly to form a Ni—Pt—P thin film. The generation of particles and compositional variation in the obtained thin film were examined. The result was 50 particles.

Example 2-11

A Ni—P alloy ingot containing 27 at % of P was melted via induction heating, and gas atomization was used to obtain a Ni-27 at % P alloy atomized powder. The obtained atomized powder was generally of a spherical shape. Next, a Ni atomized powder and a Pt powder were mixed with the Ni—P alloy atomized powder. The obtained mixed powder was hot pressed under the conditions of 830° C. and 300 kgf/cm². Consequently, a Ni—Pt—P sintered compact having a Pt content of 5 at %, a P content of 5 at % and remainder being Ni and unavoidable impurities was obtained. Moreover, the density of the obtained sintered compact was 80%. Next, the obtained sintered compact was sealed in an SUS can and subject to HIP (hot isostatic pressing) under the conditions of 830° C. and 1500 kgf/cm². As a result, the density of the obtained sintered compact was 95%.

The thus obtained Ni—Pt—P sintered compact was subject to machining such as grinding and polishing to prepare a disk-shaped sputtering target having a diameter of 440 mm φ and a thickness of 3 mmt. The compositional variation in the obtained sputtering target was examined. Consequently, the compositional variation was within 4%. Next, the average crystal grain size of this sputtering target was examined using the crosscut method based on JISH0501. Consequently, the average crystal grain size was 65 μm. Subsequently, this sputtering target was diffusion-bonded to a backing plate made from copper alloy to prepare an assembly of a Ni—Pt—P sputtering target and a copper alloy backing plate. Sputtering was performed using the assembly to form a Ni—Pt—P thin film. The generation of particles and compositional variation in the obtained thin film were examined. The result was 100 particles.

Example 2-12

A Ni—P alloy ingot containing 28 at % of P was melted via induction heating, and gas atomization was used to obtain a Ni-28 at % P alloy atomized powder. The obtained atomized powder was generally of a spherical shape. Next, a Ni atomized powder and a Pt powder were mixed with the Ni—P alloy atomized powder. The obtained mixed powder was hot pressed under the conditions of 830° C. and 300 kgf/cm². Consequently, a Ni—Pt—P sintered compact having a Pt content of 5 at %, a P content of 10 at % and remainder being Ni and unavoidable impurities was obtained. Moreover, the density of the obtained sintered compact was 80%. Next, the obtained sintered compact was sealed in an SUS can and subject to HIP (hot isostatic pressing) under the conditions of 830° C. and 1500 kgf/cm². As a result, the density of the obtained sintered compact was 95%.

The thus obtained Ni—Pt—P alloy sintered compact was subject to machining such as grinding and polishing to prepare a disk-shaped sputtering target having a diameter of 440 mm φ and a thickness of 3 mmt. The compositional variation in the obtained sputtering target was examined. Consequently, the compositional variation was within 4%. Next, the average crystal grain size of this sputtering target was examined using the crosscut method based on JISH0501. Consequently, the average crystal grain size was 70 μm. Subsequently, this sputtering target was diffusion-bonded (instead, In-bonding may be adopted) to a backing plate made from copper alloy to prepare an assembly of a Ni—Pt—P sputtering target and a copper alloy backing plate. Sputtering was performed using the assembly to form a Ni—Pt—P thin film. The generation of particles and compositional variation in the obtained thin film were examined. The result was 50 particles.

Comparative Example 2-1

A Ni shot, a Pt powder and a P ingot were melted via induction heating to achieve Ni-20 at % Pt-1 at % P, and gas atomization was used to prepare a powder. Consequently, a Ni-20 at % Pt-0.8 at % P atomized powder was obtained. P evaporated within the device and the composition deviated from the intended composition. Moreover, process loss caused by atomization was incurred, and the loss of Pt based on weight was 0.2%.

Comparative Example 2-2

A Ni shot, a Pt powder and a Ni-17 wt % P alloy ingot were melted via induction heating to achieve Ni-20 at % Pt-1 at % P, and gas atomization was used to prepare a powder. Consequently, a Ni-20 at % Pt-0.9 at % P atomized powder was obtained. P evaporated within the device and the composition deviated from the intended composition. Moreover, process loss caused by atomization was incurred, and the loss of Pt based on weight was 0.2%.

Comparative Example 2-3

A Ni shot, a Ni-20 at % Pt alloy ingot and a P ingot were melted via induction heating to achieve Ni-10 at % Pt-2 at % P, and gas atomization was used to prepare a powder. Consequently, a Ni-10 at % Pt-1.6 at % P atomized powder was obtained. P evaporated within the device and the composition deviated from the intended composition. Moreover, process loss caused by atomization was incurred, and the loss of Pt based on weight was 0.2%.

Comparative Example 2-4

A Ni shot, a Ni-20 at % Pt alloy ingot and a Ni-17 wt % P alloy ingot were melted via induction heating to achieve Ni-10 at % Pt-2 at % P, and gas atomization was used to prepare a powder. Consequently, a Ni-10 at % Pt-1.7 at % P atomized powder was obtained. P evaporated within the device and the composition deviated from the intended composition. Moreover, process loss caused by atomization was incurred, and the loss of Pt based on weight was 0.2%.

TABLE 2

| | Method of obtaining raw material powder | Target composition | Pt loss | Powder composition | HP conditions Temperature (° C.) | Pressure (kgf) |
|---|---|---|---|---|---|---|
| Example 2-1 | Ni—17 wt P atomized, Ni atomized, Pt sponge | Ni—20 at % Pt—1 at % P | — | Ni—20 at % Pt—1 at % P | 830.0 | 300.0 |
| Example 2-2 | Ni—18 wt P atomized, Ni atomized, Pt sponge | Ni—30 at % Pt—1 at % P | — | Ni—30 at % Pt—1 at % P | 830.0 | 300.0 |
| Example 2-3 | Ni—19 wt P atomized, Ni atomized, Pt sponge | Ni—10 at % Pt—2 at % P | — | Ni—10 at % Pt—2 at % P | 830.0 | 300.0 |
| Example 2-4 | Ni—20 wt P atomized, Ni atomized, Pt sponge | Ni—20 at % Pt—2 at % P | — | Ni—20 at % Pt—2 at % P | 830.0 | 300.0 |
| Example 2-5 | Ni—21 wt P atomized, Ni atomized, Pt sponge | Ni—20 at % Pt—5 at % P | — | Ni—10 at % Pt—2 at % P | 830.0 | 300.0 |
| Example 2-6 | Ni—22 wt P atomized, Ni atomized, Pt sponge | Ni—30 at % Pt—5 at % P | — | Ni—20 at % Pt—2 at % P | 830.0 | 300.0 |
| Example 2-7 | Ni—23 wt P atomized, Ni atomized, Pt sponge | Ni—10 at % Pt—10 at % P | — | Ni—10 at % Pt—2 at % P | 830.0 | 300.0 |
| Example 2-8 | Ni—24 wt P atomized, Ni atomized, Pt sponge | Ni—20 at % Pt—10 at % P | — | Ni—20 at % Pt—2 at % P | 830.0 | 300.0 |
| Example 2-9 | Ni—25 wt P atomized, Ni atomized, Pt sponge | Ni—5 at % Pt—1 at % P | — | Ni—5 at % Pt—1 at % P | 830.0 | 300.0 |
| Example 2-10 | Ni—26 wt P atomized, Ni atomized, Pt sponge | Ni—5 at % Pt—2 at % P | — | Ni—5 at % Pt—2 at % P | 830.0 | 300.0 |
| Example 2-11 | Ni—27 wt P atomized, Ni atomized, Pt sponge | Ni—5 at % Pt—5 at % P | — | Ni—5 at % Pt—5 at % P | 830.0 | 300.0 |
| Example 2-12 | Ni—28 wt P atomized, Ni atomized, Pt sponge | Ni—5 at % Pt—10 at % P | — | Ni—5 at % Pt—10 at % P | 830.0 | 300.0 |
| Comparative Example 2-1 | Ni, Pt, P are melted → atomized | Ni—20 at % Pt—1 at % P | Great | Ni—20 at % Pt—0.8 at % P | 830.0 | 300.0 |
| Comparative Example 2-2 | Ni, Pt, Ni—P are melted → atomized | Ni—20 at % Pt—1 at % P | Great | Ni—20 at % Pt—0.9 at % P | 830.0 | 300.0 |
| Comparative Example 2-3 | Ni, Ni—Pt, P are melted → atomized | Ni—10 at % Pt—2 at % P | Great | Ni—10 at % Pt—1.6 at % P | 830.0 | 300.0 |
| Comparative Example 2-4 | Ni, Ni—Pt, Ni—P are melted → atomized | Ni—10 at % Pt—2 at % P | Great | Ni—10 at % Pt—1.7 at % P | 830.0 | 300.0 |

TABLE 2-continued

|  | Density after HP | Compositional deviation after HP | HIP conditions Temperature (°C.) | HIP conditions Pressure (kgf) | Density after HIP (%) | Compositional variation (%) Pt | Compositional variation (%) P | Grain size | Number of particles |
|---|---|---|---|---|---|---|---|---|---|
| Example 2-1 | 80 | None | 830.0 | 1500.0 | 95 | 0.5 | 2.0 | 60 | 50 |
| Example 2-2 | 80 | None | 830.0 | 1500.0 | 95 | 0.7 | 3.0 | 70 | 100 |
| Example 2-3 | 80 | None | 830.0 | 1500.0 | 95 | 0.6 | 3.0 | 65 | 50 |
| Example 2-4 | 80 | None | 830.0 | 1500.0 | 95 | 0.8 | 2.0 | 70 | 50 |
| Example 2-5 | 80 | None | 830.0 | 1500.0 | 95 | 0.6 | 3.0 | 80 | 50 |
| Example 2-6 | 80 | None | 830.0 | 1500.0 | 95 | 0.8 | 2.0 | 75 | 100 |
| Example 2-7 | 80 | None | 830.0 | 1500.0 | 95 | 0.6 | 3.0 | 70 | 50 |
| Example 2-8 | 80 | None | 830.0 | 1500.0 | 95 | 0.8 | 2.0 | 70 | 50 |
| Example 2-9 | 80 | None | 830.0 | 1500.0 | 95 | 0.6 | 3.0 | 70 | 50 |
| Example 2-10 | 80 | None | 830.0 | 1500.0 | 95 | 0.8 | 2.0 | 70 | 50 |
| Example 2-11 | 80 | None | 830.0 | 1500.0 | 95 | 0.6 | 3.0 | 65 | 100 |
| Example 2-12 | 80 | None | 830.0 | 1500.0 | 95 | 0.8 | 2.0 | 70 | 50 |
| Comparative Example 2-1 | 80 | Deviated | — | — | — | — | — | — | — |
| Comparative Example 2-2 | 80 | Deviated | — | — | — | — | — | — | — |
| Comparative Example 2-3 | 80 | Deviated | — | — | — | — | — | — | — |
| Comparative Example 2-4 | 80 | Deviated | — | — | — | — | — | — | — |

The present invention can provide a high density Ni—P alloy sputtering target having a small compositional variation in which the evaporation of P, which is problematic in terms of safety, can be inhibited by strictly controlling the P content. Consequently, the present invention yields a superior effect of being able to form a thin film having favorable properties. Moreover, the present invention can provide a high density Ni—Pt—P alloy sputtering target based on powder metallurgy without requiring any large equipment for melting/casting and rolling processes. Consequently, the present invention yields a superior effect of being able to inhibit the generation of particles during sputtering. The sputtering target of the present invention is effective for forming thin films for use in hard disks and other magnetic recording mediums.

The invention claimed is:

1. A method of producing a Ni—P alloy sputtering target, wherein a Ni—P alloy containing 15 to 17 wt % of P and remainder being Ni and unavoidable impurities is melted and atomized to prepare a Ni—P alloy atomized powder having an average grain size of 100 µm or less, the Ni—P alloy atomized powder is mixed with a Ni atomized powder, and the obtained mixed powder is hot pressed to produce a sintered compact containing 1 to 10 at % of P and a remainder of Ni and unavoidable impurities.

2. The method of producing a Ni—P alloy sputtering target according to claim 1, wherein hot isostatic pressing is performed after the hot press.

3. A method of producing a Ni—Pt—P alloy sputtering target, wherein a Ni—P alloy containing 15 to 21 wt % of P and remainder being Ni and unavoidable impurities is melted and atomized to prepare a Ni—P alloy atomized powder having an average grain size of 100 µm or less, the Ni—P alloy atomized powder is mixed with a Ni atomized powder and a Pt powder, and the obtained mixed powder is hot pressed to produce a sintered compact containing 1 to 10 at % of P, 1 to 30 at % of Pt, and a remainder of Ni and unavoidable impurities.

4. The method of producing a Ni—Pt—P sputtering target according to claim 3, wherein hot isostatic pressing is performed after the hot press.

* * * * *